US008552625B1

(12) United States Patent
Butler et al.

(10) Patent No.: US 8,552,625 B1
(45) Date of Patent: Oct. 8, 2013

(54) CANTILEVER TYPE ACOUSTIC TRANSDUCTION APPARATUS

(71) Applicant: Image Acoustics, Inc., Cohasset, MA (US)

(72) Inventors: John L. Butler, Cohasset, MA (US); Alexander L. Butler, Weymouth, MA (US)

(73) Assignee: Image Acoustics, Inc., Cohasset, MA (US)

( * ) Notice: Subject to any disclaimer, the term of this patent is extended or adjusted under 35 U.S.C. 154(b) by 0 days.

(21) Appl. No.: 13/626,138

(22) Filed: Sep. 25, 2012

Related U.S. Application Data

(60) Provisional application No. 61/539,018, filed on Sep. 26, 2011.

(51) Int. Cl.
*H01L 41/08* (2006.01)
*H01L 41/09* (2006.01)

(52) U.S. Cl.
CPC .................................. *H01L 41/0926* (2013.01)
USPC ............................ 310/370; 310/331; 310/332

(58) Field of Classification Search
USPC .......................................... 310/330–332, 370
See application file for complete search history.

(56) References Cited

U.S. PATENT DOCUMENTS

| | | | |
|---|---|---|---|
| 4,332,986 A | 6/1982 | Butler | |
| 4,742,499 A | 5/1988 | Butler | |
| 4,754,441 A | 6/1988 | Butler | |
| 4,845,688 A | 7/1989 | Butler | |
| 4,864,548 A | 9/1989 | Butler | |
| 5,047,683 A | 9/1991 | Butler et al. | |
| 5,184,332 A | 2/1993 | Butler | |
| 5,875,154 A * | 2/1999 | Dechico | 367/163 |
| 6,177,756 B1 * | 1/2001 | Yachi et al. | 310/370 |
| 6,490,925 B2 * | 12/2002 | Inoue et al. | 73/504.16 |
| 6,734,604 B2 | 5/2004 | Butler et al. | |
| 6,820,966 B1 * | 11/2004 | Drury et al. | 347/57 |
| 6,950,373 B2 | 9/2005 | Butler et al. | |
| 7,168,289 B2 * | 1/2007 | Kikuchi | 73/1.37 |
| 7,292,503 B2 | 11/2007 | Butler et al. | |
| 7,372,776 B2 | 5/2008 | Butler et al. | |
| 7,401,517 B2 * | 7/2008 | Pan et al. | 73/504.16 |
| 7,453,186 B1 | 11/2008 | Butler et al. | |
| 7,692,363 B2 | 4/2010 | Butler et al. | |
| 2006/0162447 A1 * | 7/2006 | Ogura | 73/504.12 |
| 2011/0271760 A1 * | 11/2011 | Ohkoshi et al. | 73/504.12 |
| 2012/0103093 A1 * | 5/2012 | Yanagisawa et al. | 73/504.12 |
| 2012/0132002 A1 * | 5/2012 | Dube et al. | 73/504.16 |
| 2012/0326571 A1 * | 12/2012 | Shimura et al. | 310/370 |

OTHER PUBLICATIONS

L. Butler, A. L. Butler and J. A. Rice, "A tri-modal directional transducer," J. Acoust. Soc. Am. 115, 658-665 (Feb. 2004).
J. L. Butler, A. L. Butler and S. C. Butler, The modal Projector, J. Acoust. Soc. Am. 129, 1881-1889 (Apr. 2011).
L. Butler and J. L. Butler, "The octoid modal vector projector," (A) J. Acoust. Soc. Am., 130, 2505 (Oct. 2011).

* cited by examiner

*Primary Examiner* — Jaydi San Martin
(74) *Attorney, Agent, or Firm* — David M. Driscoll, Esq.

(57) ABSTRACT

An electro-mechanical transducer provides a very low frequency wide band response by using a quad configuration of piezoelectric cantilevers, providing additive output between the resonant frequencies of the cantilevers and achieves this at great depths under free flooded or oil filled conditions.

23 Claims, 13 Drawing Sheets

CANTILEVER TYPE ACOUSTIC TRANSDUCTION APPARATUS

RELATED CASES

Priority for this application is hereby claimed under 35 U.S.C. §119(e) to commonly owned and co-pending U.S. Provisional Patent Application No. 61/539,018 which was filed on Sep. 26, 2011 and which is incorporated by reference herein in its entirety.

GOVERNMENT RIGHTS

The present invention was made, in part, with Government support under a Government contract. The Government may have certain rights in the invention.

FIELD OF THE INVENTION

The present invention relates in general to transducers, and more particularly to underwater acoustic transducers. The present invention also relates to a transducer capable of radiating acoustic energy over a wide band of frequencies including very low frequencies. More particularly, the present invention relates to a multiply-resonant, piezoelectric-cantilever symmetrical-transducer with preferably four vibrating tines mounted from a common stiff rigid structure. Even more particularly, the present invention relates to such a transducer that operates in the bending mode.

BACKGROUND OF THE INVENTION

Low frequency underwater sound transducers require a large volume and a compliant structure in order to obtain a low resonant frequency, such as 15 Hz, along with a high output level. This can be difficult to accomplish within a fixed volume at very low frequencies, even at shallow depths, and it becomes extremely challenging at deep depths, such as at depths where a submarine may reside, and where the hydrostatic pressure is high.

Accordingly, it is an object of the present invention to provide an improved low frequency acoustic transducer.

Another object of the present invention is to provide a low resonant frequency transducer that is operable at low frequencies such as 15 Hz and that generates substantially high output levels.

Still another object of the present invention is to provide an acoustic transducer as mentioned above and that can be accomplish within a fixed volume at very low frequencies at both shallow and deep depths.

Still a further object of the present invention is to provide an acoustic transducer with the above objectives and that is further characterized by having a wide bandwidth.

SUMMARY OF THE INVENTION

To accomplish the foregoing and other objects, features and advantages of the invention there is provided an improved electro-mechanical transduction apparatus that employs a symmetrical system that preferably excites only odd bending modes, providing additive output between the successive resonant frequencies, yielding a very wide band response from very low frequencies to high frequencies, with additive output between the successive resonant frequencies, because of the excitation of preferably only the odd modes of vibration. In one embodiment there is provided a "quad" cantilever resonant structure providing one of the lowest flexural resonances for a given length and which there are no nulls between the modes of vibration that cannot be mitigated providing a wide band response The device may be comprised of four piezoelectric cantilever structures, each driven with opposite phase on opposite sides, creating bending motion, and mounted and driven symmetrically or anti-symmetrically on or from a common stiff base along with a pair of endplates.

In accordance with the invention there is provided an electro-mechanical transduction apparatus that employs at least four mechanical cantilever benders of which at least two are electro-mechanically drive and all four attached to a common central stiff mounting structure. In its most basic form, two of the cantilevers are mounted in the same plane on one side of the mounting structure with the free ends of the cantilevers on the opposite ends, and the other two cantilevers are mounted on the opposite side of the mounting structure. This quad arrangement may be used to form an array of these transducers by stacking additional quad units on the remaining surfaces of the support structure. Stiff plates can also be mounted on the remaining surfaces to reduce the out-of-phase cancellation of the interior and exterior radiation from the cantilever tines, leaving only acoustic radiation from the free open end of the interior cavity. Operation is in the free flooded mode with optional contained interior compliant fluid for improved low frequency performance and allowing operation at deep ocean depths.

For shallow water operation where the hydrostatic pressure is not as great, the open ends can be blocked and the interior filled with a gas or air for greater output. Air backing can also be used under greater depths by filling the interior with compressed air or a compliant fluid or fluid filled with compliant structures could also be used. Greater output from a single quad structure can be obtained by adding four more cantilever tines on the two remaining surfaces of the mounting structure with the interior filled with either a gas or fluid.

Although the invention described herein serves as a means for obtaining a significant very low frequency wide band underwater acoustic response, it could also be used in air as a source of sound and as an alternative to the common tuning fork. The structure could also serve as a receiver of sound and vibration, such as a microphone, hydrophone or accelerometer.

In accordance with one embodiment of the present invention there is provided an electro-mechanical transduction apparatus that comprises: at least four symmetrically mounted piezoelectric driven cantilever tines with the greatest motion at its ends, along with isolated end plates to reduce acoustic cancellation, achieving very low frequency acoustic response because of the cantilever resonance operation and achieving wideband performance because of odd mode excitation yielding an additive output between modes.

In accordance with other aspects of the present invention there is provided the means for stacking these quad elements to form an array of elements or means for adding four more cantilever tines to create an eight tine dual quad structure. There is also means provided for operation with a free flooding or contained fluid within the interior cavity of the cantilever structure and pressure release means for increasing the interior compliance. In addition to this there is also provided a means for replacing the piezoelectric tines in one plane with passive non-piezoelectric tines, such as steel or aluminum, yielding a response similar to the all piezoelectric response.

BRIEF DESCRIPTION OF THE DRAWINGS

Numerous other objects, features and advantages of the invention should now become apparent upon a reading of the following detailed description taken in conjunction with the accompanying drawings, in which.

DETAILED DESCRIPTION

In accordance with the present invention, there is now described a number of different embodiments for practicing the present invention. In the main aspect of the invention there is provided four piezoelectric cantilevers mounted on a central support providing very low frequency and wide band response even at great ocean depths. The central rigid mount is important to this cantilever invention as it provides the rigid boundary conditions for the cantilever tines and because of the design symmetry no additional masses or structures are needed for the cantilever central boundary condition on any of the tines operating in a symmetric mode of vibration.

Figure 1:
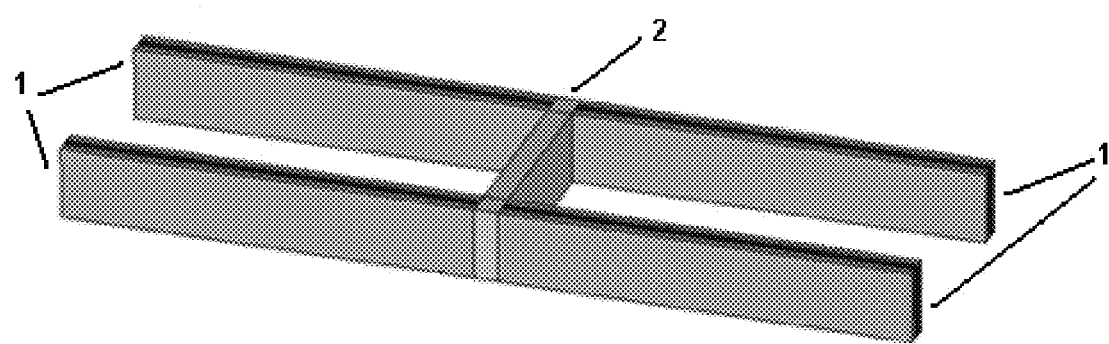
FIG. 1 schematically illustrates the quad cantilever transducer with four piezoelectric tines driven into the bending mode and mounted on a common base mounting structure.

A simplified diagram of the cantilever acoustic transducer is illustrated in the four tine, 1, quad arrangement of FIG. 1. When operated in the water there would be top and bottom plates (not shown) attached to the central rigid mount, 2, and mechanically isolated from the cantilever tines 1 with water filling the interior section. As illustrated in FIG. 1, the central support mounts two, spaced-apart tines, in opposed directions there-from. This free flooding would require a rubber boot and/or potting to electrically isolate the piezoelectric benders, tines 1, from the exterior water and interior water, which allows for pressure equalization and operation at great ocean depths. Transducers could be stacked on top of each other and used together as an array to attain a greater source level.

Figure 2:
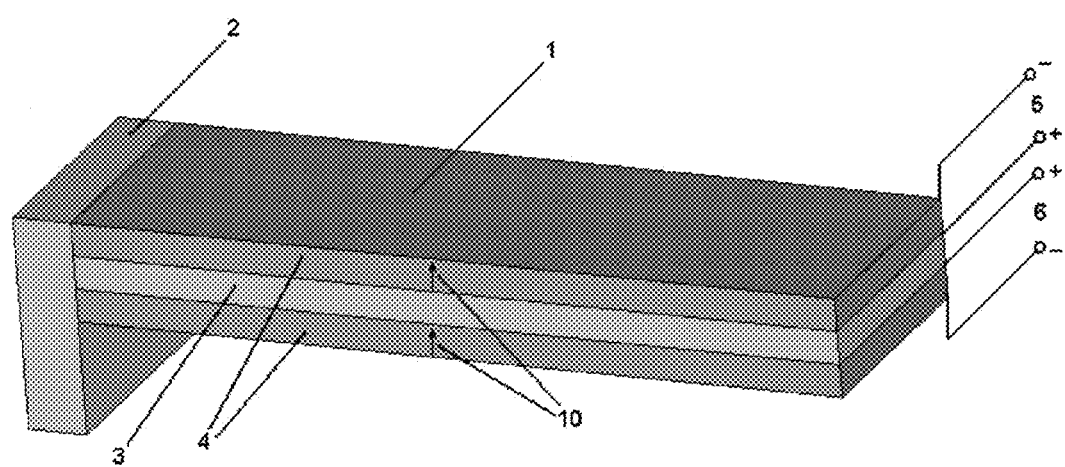
FIG. 2 schematically illustrates, for one tine, the electrical connections for piezoelectric 31 mode tri-laminar operation with two plates of piezoelectric material mounted on a central substrate wired for bending mode operation.

FIG. 2 schematically illustrates the wiring arrangement for the piezoelectric plates or bars, 1, driven by voltages, 5, and, 6, for operation in the piezoelectric 31 mode. Because of the polarization direction, arrows 10, and the wired polarity shown as, 5, and 6, the top and bottom piezoelectric plates, 4, of FIG. 2 are driven out of phase causing bending motion of the cantilever tine, 1, mounted on structural support base, 2. In this particular tri-laminar arrangement a central inactive substrate, 3, is used to obtain a higher electromechanical coupling coefficient. In FIG. 2 the various layers or plates 3 and 4 may be attached together in any one of a number of ways, so that all plates bend together.

Figure 3A:
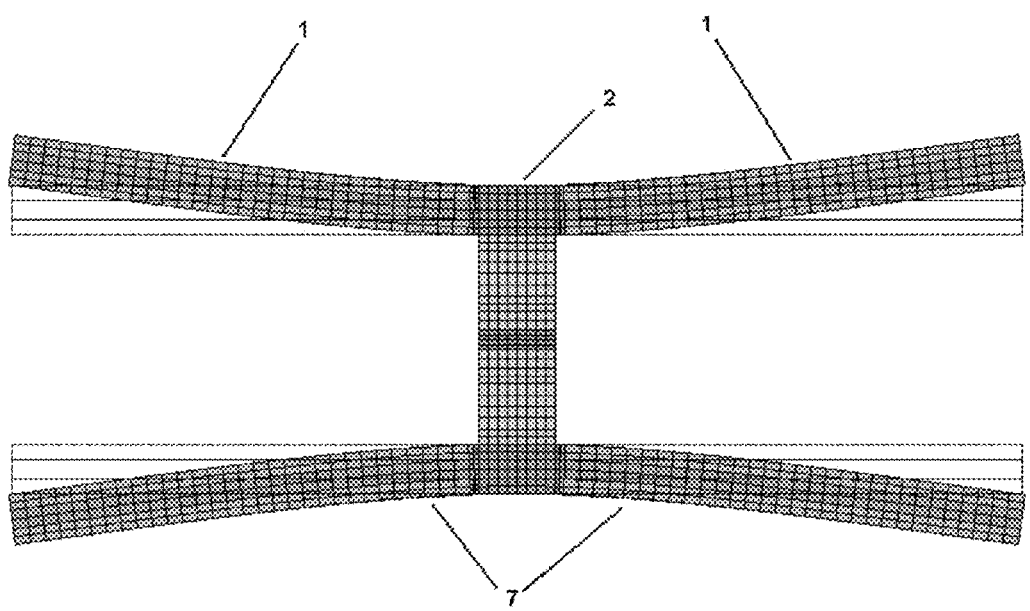
FIG. 3a schematically illustrates the motion of the quad structure in a symmetric mode of vibration.
Figure 3B:
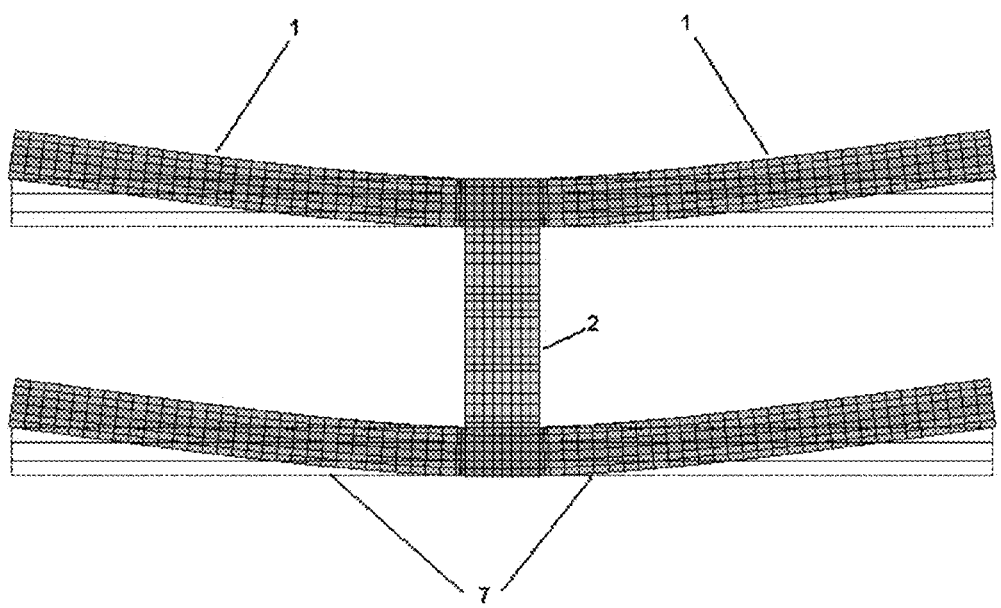
FIG. 3b schematically illustrates the motion of the quad structure in an anti-symmetric mode of vibration.

FIG. 3a illustrates the motion of the cantilevers at the fundamental symmetric mode of vibration of a quad section. Here the two bottom tines 7 are wired in the same way of the two top tines 1 to create this symmetric vibration shown where the top two tines move in a direction opposite the bottom two tines. FIG. 3b illustrates the motion of the cantilevers at the fundamental anti-symmetric mode of vibration of a quad section. Here the two bottom tines, 7, are wired oppositely in phase from the top two tines creating all tine motions in the same direction with the center mount 2 moving in the opposite direction of the four tines.

The cantilever is an ideal component for very low frequency wide band performance. The fundamental resonance, $f_r$, of a cantilever bender bar of length L and thickness t may be written as $f_r=0.1615$ ct/L$^2$ where c is the bar sound speed in the material. The cantilever mode design has the advantage of achieving a low fundamental resonance frequency from a compact size. It has not only a size advantage, but a wideband response advantage, with additive motion between the overtones. The odd quarter wavelength multiples of the overtones are not harmonically related and the first few are at 6.27 $f_r$ and 17.55 $f_r$. The cantilever is excited by reversing the phase or direction of polarization of the electric field on opposite sides of the piezoelectric cantilever bender tines.

Figure 4:
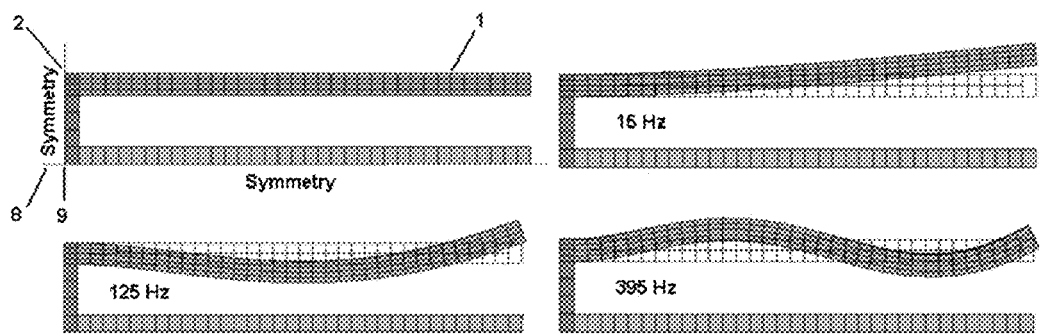
FIG. 4 illustrates the cantilever motion of the first three modes of vibration along with the initial case of no motion.

A finite element symmetry model of one tine 1, of the cantilever quad design, with length approximately 30 inches, is shown in FIG. 4 mounted on the central rigid support, 2, with symmetry planes 8 and 9. The motion of the first three modes of cantilever vibration at 15, 125 and 395 Hz are illustrated in FIG. 4. Although cantilever benders provide some of the lowest resonances for a given length, they are susceptible to excessive bending stress under deep operation and in these cases the design can benefit from pressure equalization.

Figure 5:
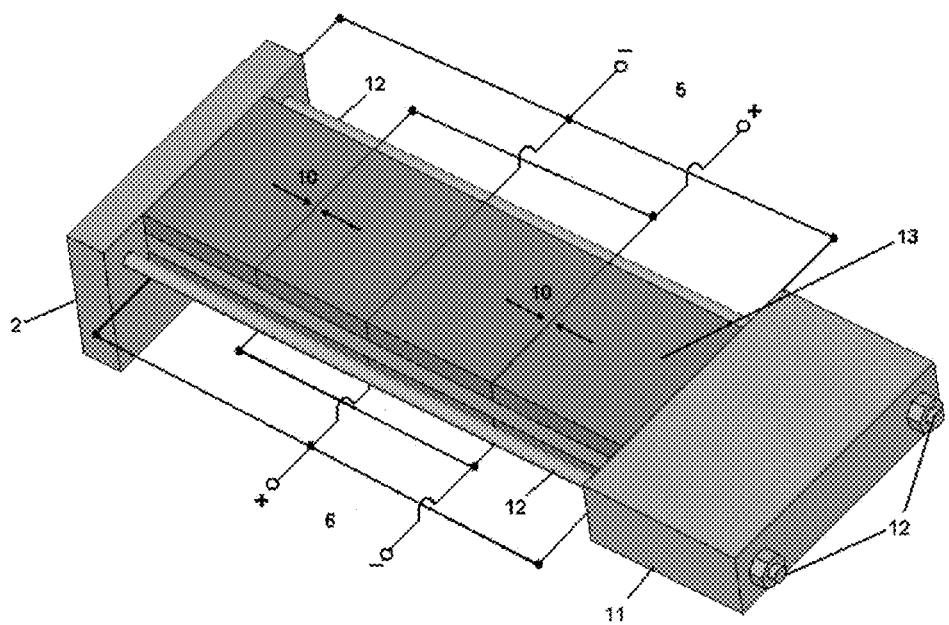
FIG. 5 illustrates a single cantilever of the quad structure with an end mass along with two compression rods and wired for piezoelectric operation in the 33 mode.

FIG. 5 illustrates schematically a 33 mode arrangement, for a single tine, and which has approximately twice the coupling coefficient of the 31 mode arrangement of FIG. 2. Here, for simplicity, FIG. 5 shows only four 33 mode piezoelectric plates 13, with the direction of polarization indicated by the arrows 10. The top and bottom part of the plates 13, are connected out of phase to excite the bending mode of this single cantilever tine of a quad unit as illustrated in FIG. 1. Also illustrated is the mass 11, which replaces part of the piezoelectric structure of the cantilever. The use of steel for mass 11, allows a reduction in cost, approximately the same fundamental resonance frequency and yet an improved coupling coefficient. This is possible since there is little bending at this free end of the cantilever, and a piezoelectric section here would only add electrical capacity but little bending motion. Two high strength tie rods 12 are also provided to supply the needed compression on the piezoelectric material under high drive. Terminals 5 and 6 illustrate reversed phase operation between the upper and lower electrodes.

Figure 6:
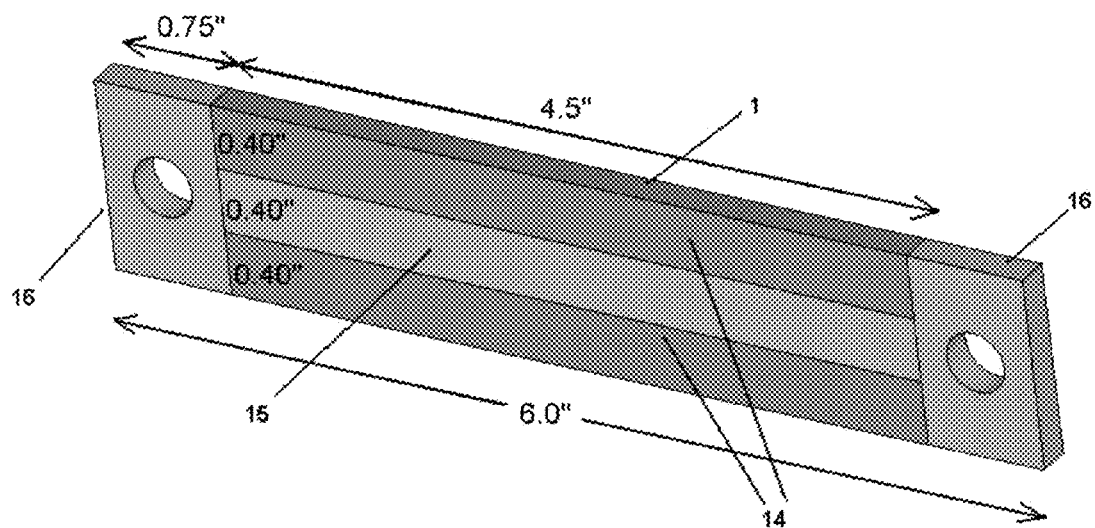
FIG. 6 illustrates a single piezoelectric element showing a margin separating the electrodes as well as two holes for the two compression tie rods.

In the embodiment shown in FIG. 5 a larger number of thinner piezoelectric pieces 13 may be used in actual practice allowing a lower voltage. One such piezoelectric piece is illustrated in FIG. 6 with electrode surfaces 14, inactive substrate 15, and end pieces 16. The end pieces 16 are provided with holes to accept the tie rods, 12, such as illustrated in FIG. 5. An alternative improved performance arrangement would be to extend electrode polarized piezoelectric material to the end of the end pieces or, more simply, but with reduced performance, eliminate the end pieces 16 as illustrated in FIG. 5. In practice, the tines of the quad elements could be made in modular form, possibly 10 modules, each containing 14 PZT piezoelectric elements with a bar thickness on the order of 0.20 inches.

FIG. 6 schematically illustrates a possible six inch height of each quad element of this sample design, which contains 4.5 inches of piezoelectric ceramic PZT-8, active piezoelectric material, sandwiched between two 0.75" plates of G-10 (or possibly PVC or a cast composition) or better yet, extended active piezoelectric material. Each of these plastic or ceramic plates has holes large enough for high strength steel compression tie rods. These two tie rods provide the necessary compressive bias on the PZT piezoelectric material. A cross section of this arrangement is illustrated in FIG. 6 showing the PZT with the split electrodes, allowing oppositely phased voltages or reversed polarization for obtaining operation in the bending mode. This design is referred to as a 33 mode of operation as the electric field and useful displacements are in the same direction and parallel to the direction of polarization of the piezoelectric ceramic. This direction is perpendicular to the electrode surfaces and through the thickness of the bar. Alternatively, the two end pieces may also be piezoelectric with electrodes and margin of 0.40 inches and two holes for the tie rods, increasing the fully active size to, in this case, 6 inches.

Figure 7:
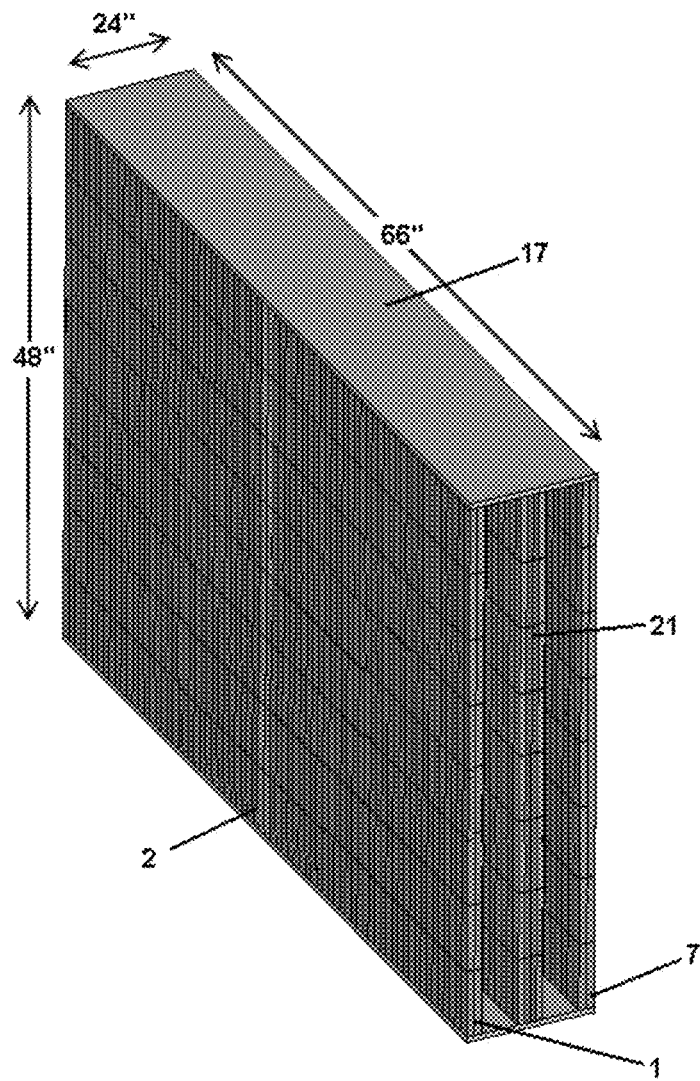
FIG. 7 illustrates an array of quad units along with stiff end plates and an intermediate supporting bar.

A specific array of quad elements is illustrated in FIG. 7 and shows, approximately, an overall length of 66", thickness of 24" and 48" height for this particular transducer example. FIG. 7 also shows the central rigid mounting structure 2, along with a central support bar 21, which together with structure 2, support the end pates 17, on the top and bottom of the array.

Figure 8A:
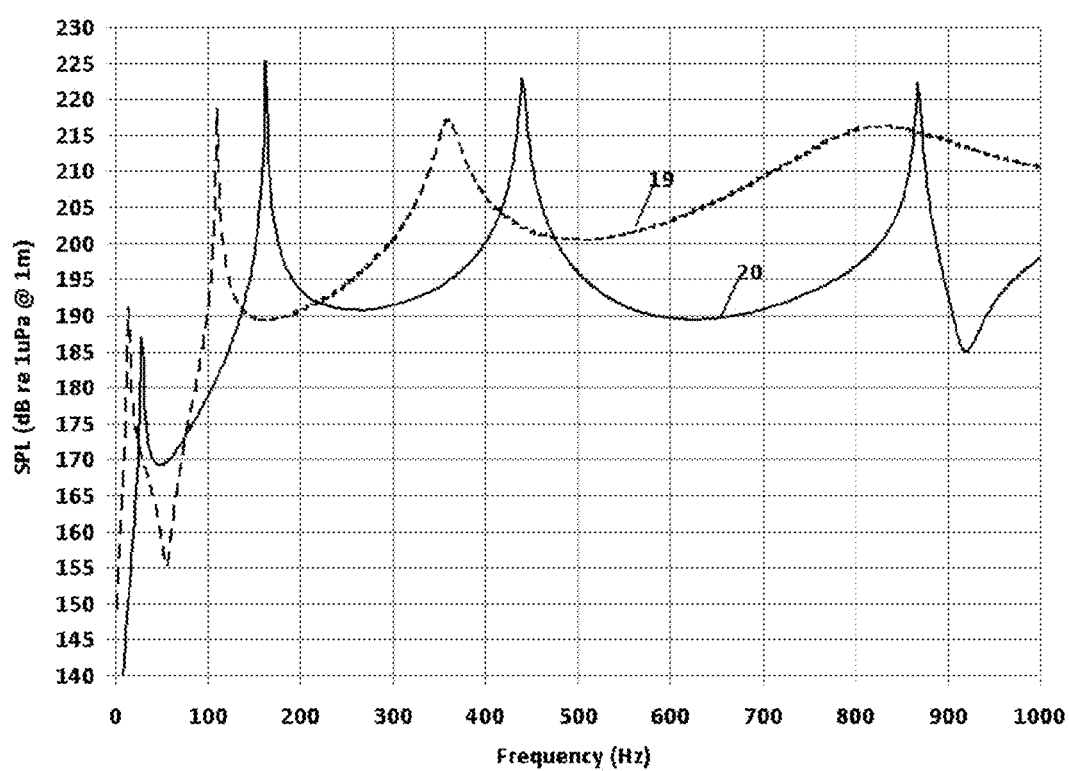
FIG. 8a shows the response (output versus frequency) of an array of quad units with stiff end plates operating in the symmetric, 19, and anti-symmetric mode, 20.
Figure 8B:
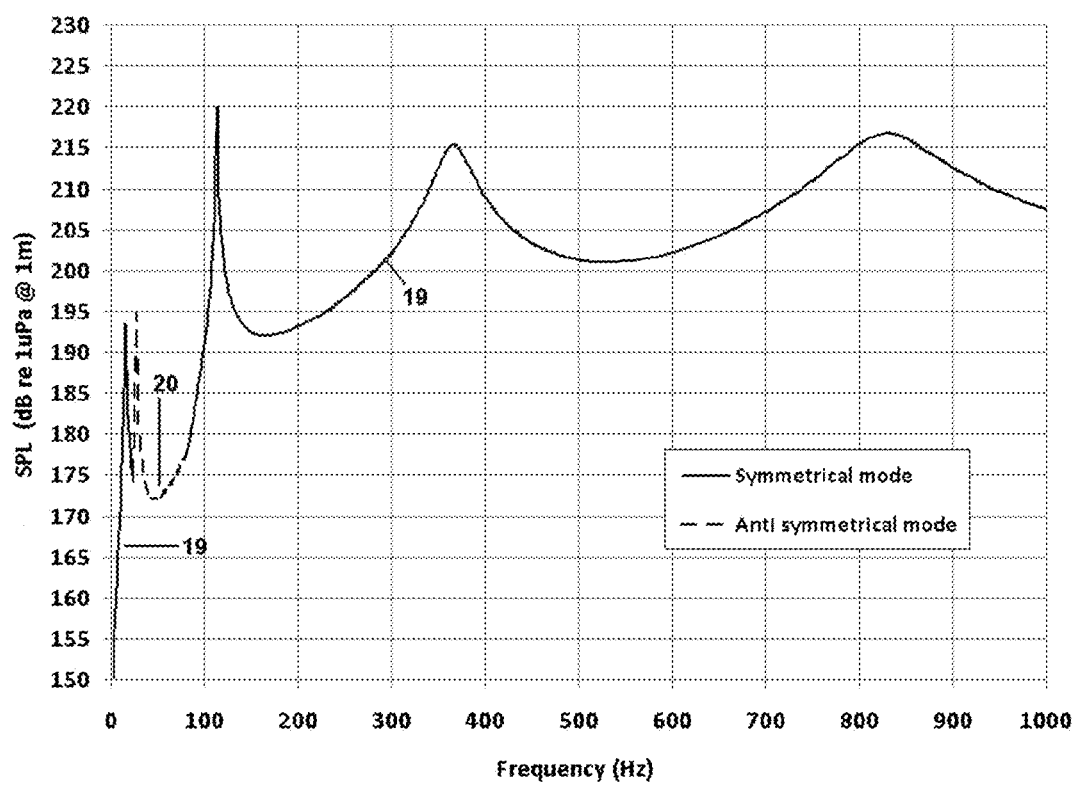
FIG. 8b shows the response of an array of quad units with stiff end plates operating in the symmetric mode, 19, spliced with the anti-symmetric mode, 20, response.
Figure 8C:
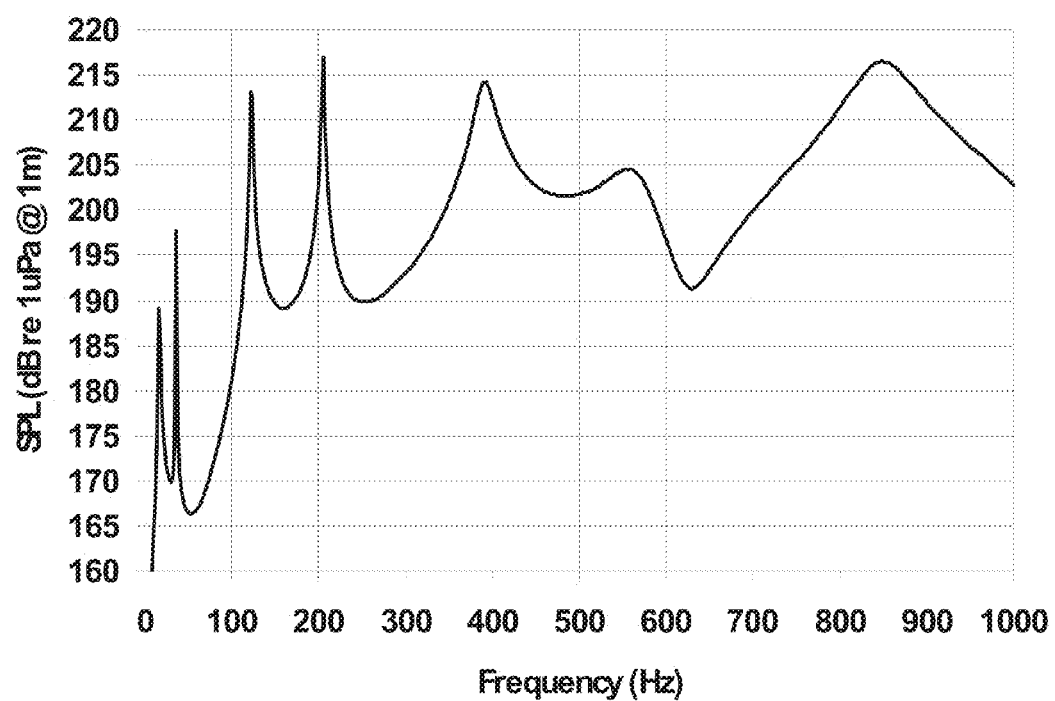
FIG. 8c shows the response of an array of quad units with stiff end plates operating with the back piezoelectric tine section replaced with a metal parasitic tine section.

The finite element calculated sound pressure level (SPL) response for the array of FIG. 7 with piezoelectric PZT pieces of FIG. 6 is shown in FIGS. 8a, 8b and 8c for a silicone oil filled condition for improved very low frequency response. The first three flexural cantilever resonances and additive wide band response are seen in FIG. 8a which shows the case for symmetric drive, 19, and anti-symmetric drive, 20. The greater reduction in the vicinity of 50 Hz of the symmetric drive, 19, condition can be improved by splicing in the response of the symmetric drive, 20, as illustrated in FIG. 8b. Direct synthesis of the two motions driven at the same voltage amplitude, illustrated in FIGS. 3a and 3b, provide a condition where the bottom two tines, 7, cancel each other as if they were not driven at all. This condition can also be achieved by simply not driving the bottom two tines and replacing them with a passive material such as aluminum or steel, creating a passive parasitic radiating resonator. The response for this case, where only the tines, 1, are piezoelectric driven and the bottom tines, 7, are steel is illustrated in FIG. 8c.

Figure 9:
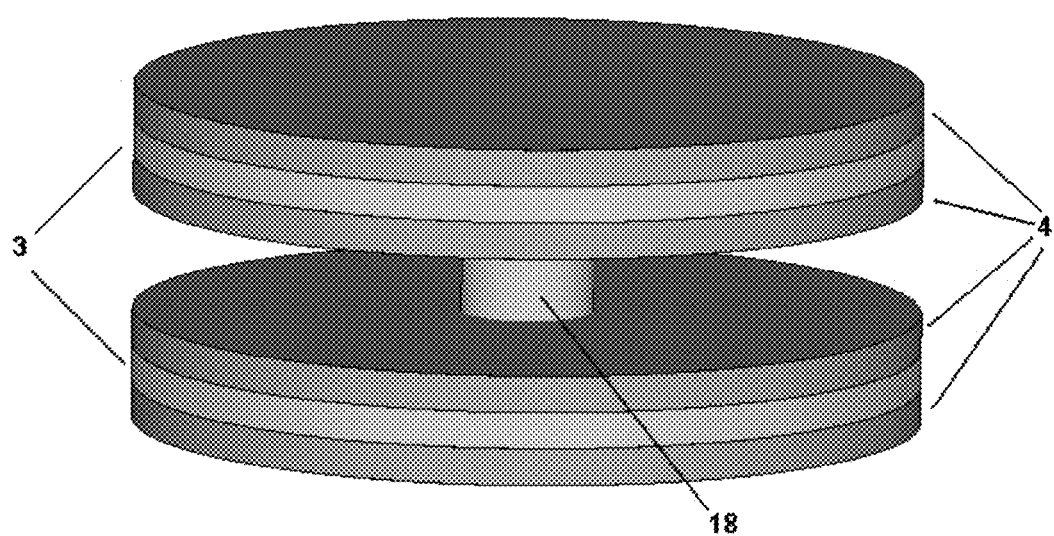
FIG. 9 schematically illustrates a center supported dual bender transducer composed of two tri-laminar piezoelectric drive circular plates.
Figure 10:
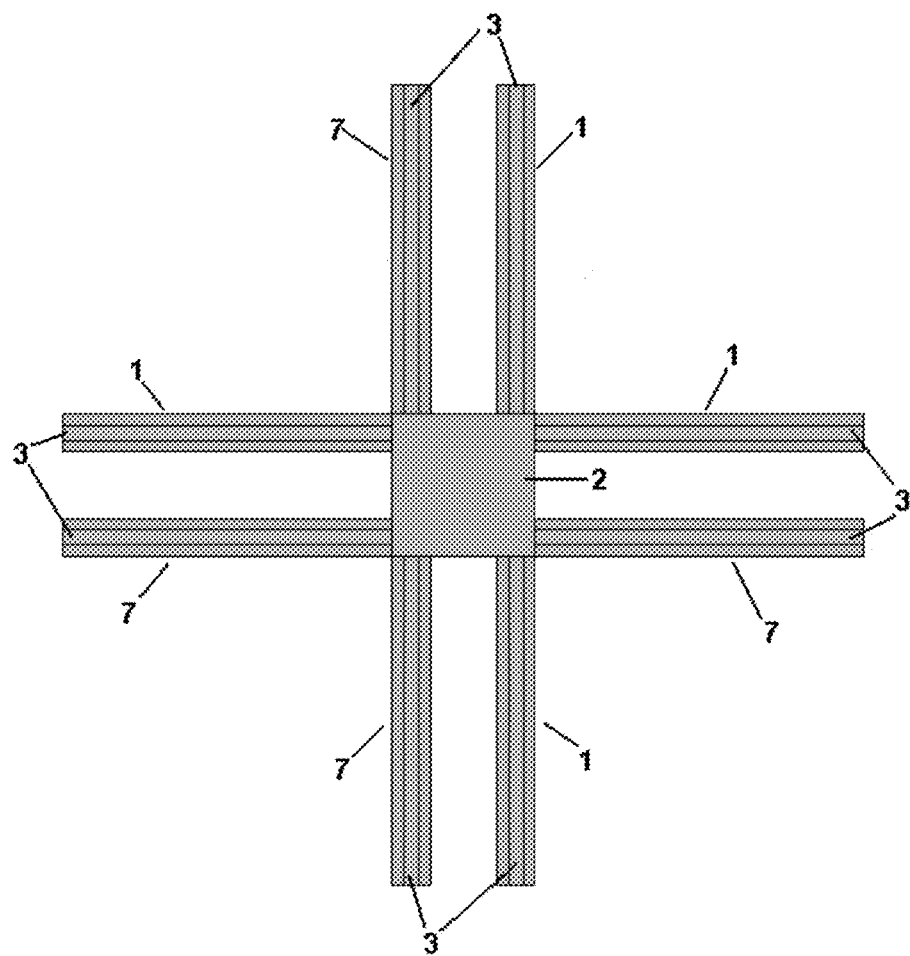
FIG. 10 schematically illustrates a center supported dual quad bender transducer composed of eight tri-laminar piezoelectric drive bender bars.

Although the focus of this invention is on cantilever bender bars, the same principles apply to a pair of flexural disc transducers with a center mount between the two, yielding a fundamental resonance frequency that is nearly twice as high as the quad cantilever construction, but with greater output because of the larger radiating area. This alternative configuration is schematically illustrated in FIG. 9 showing a center post 18, tri-laminar planar-mode piezoelectric discs 4 and center substrates 3. Center post 18 may be constructed of a stiff metal material such as steel. Although not illustrated, the piezoelectric discs may also be replaced with piezoelectric square plates. An additional alternative eight tine arrangement, instead of the four tine quad structure of FIG. 1, is illustrated in FIG. 10. This eight tine structure allows greater output from the piezoelectric tines 1 and 7, with substrates 3, and the square supporting stiff structure 2, preferably steel. Although not shown, a structure composed of three tine pairs 1, 7, of piezoelectric tines may be used with an equilateral triangular supporting structure instead of the square member 2 shown in FIG. 10.

The above principles of this invention may be applied to transducers which transmit or receive acoustic waves in a fluid or gas. The principles can also be applied to accelerometers. Moreover, the electromechanical material may be single crystal material, piezoelectric ceramic, electrostrictive, magnetostrictive or electromagnetic. Common electromechanical transduction material such as PZT, PMN-PT, terfenol-D and galfenol could be used with this invention.

The following are a list of reference numbers associated with the specification and drawings.

1. Top piezoelectric tines
2. Central rigid mount
3. Inactive substrate
4. Piezoelectric element
5. Electrodes
6. Electrodes
7. Bottom piezoelectric tines
8. Symmetry plane
9. Symmetry plane
10. Polarization arrow
11. Tine end mass
12. Tie rod
13. Piezoelectric section
14. Electrode surface
15. Margin between electrodes
16. End piece
17. End plate
18. Center support rod
19. Symmetric response
20. Anti-symmetric response
21. End plate support beam

Having now described a limited number of embodiments of the present invention, it should now become apparent to those skilled in the art that numerous other embodiments and modifications thereof are contemplated as falling within the scope of the present invention, as defined in the appended claims.

What is claimed is:

1. A cantilever bender transducer with a minimum of four electromechanically active bending beam tines each having inner and outer tine ends and opposed sides, a center support member, the inner ends of respective tines commonly supported at the center support member, one pair of tines connected to the center support member and the other pair of tines, also connected to the center support member but extending in the opposite direction to the one pair of tines, and with at least two of the bending beam tines being activated, each said at least two active tines comprised of an inactive substrate and opposed piezoelectric plates forming the opposed sides and integrally formed with said inactive substrate, said inactive substrate and piezoelectric plates being coterminous so that the inactive substrate and opposed piezoelectric plates bend together when excited, and a voltage source for driving said active tines.

2. The cantilever bender transducer of claim 1 with an end mass connected to at least one tine and providing an improved coupling coefficient.

3. The cantilever bender transducer of claim 1 wherein the center support member is elongated and has opposed elongated sides, one pair of tines spaced apart and connected along one side of the center support member and the other pair of tines spaced apart and connected along the opposed side of the center support member.

4. The cantilever bender transducer of claim 1 further including two tie rods for compression of the piezoelectric material.

5. The cantilever bender transducer of claim 4 with adjacent pieces on either side of the cantilever tines with a hole in each, acting as receiver for the compressive tie rods.

6. The cantilever bender transducer of claim 5 where the adjacent pieces also act as a conduit for the electrical wiring of the transducer active pieces.

7. The cantilever bender transducer of claim 1 comprising eight cantilever tines constructed and arranged with pairs of tines oriented in the 0, 90, 180 and 270 degree directions.

8. The cantilever bender transducer of claim 1 further including a pair of center disposed inactive tines disposed between the pair of active tines.

9. The cantilever bender transducer of claim 1 wherein the transducer is free flooded with water.

10. The cantilever bender transducer of claim 1 including a third pair of tines and a fourth pair of tines, said third pair of tines connected to the center support member and said fourth pair of tines, also connected to the center support member, said third and fourth pairs of tines extending substantially orthogonal to the one and other pairs of tines.

11. The cantilever bender transducer of claim 10 wherein the center support member is substantially square.

12. The cantilever bender transducer of claim 1 including a center inactive tine that is constructed of a pressure release material, such as paper, corprene, foam rubber or other very compliant structure, centered on the support structure between cantilever pairs.

13. The cantilever bender transducer of claim 1 excited by ceramic or single crystal piezoelectric or electrostrictive material with separated electrodes for excitation of opposite phased bending motion operating in the 33 or 31 mode.

14. The cantilever bender transducer of claim 1 operating in one of a symmetric mode and an anti-symmetric mode.

15. The cantilever bender transducer of claim 1 operating in the symmetric mode over part of the frequency band and operating in the anti-symmetric mode over the remaining part of the frequency band.

16. The cantilever bender transducer of claim 1 operating simultaneously in the symmetric and anti-symmetric modes.

17. The cantilever bender transducer of claim 1 operating with half the tines electro-mechanically activated with the other half of the tines composed of non-electromechanically active material and acting as passive parasitic radiating resonators.

18. The cantilever bender transducer of claim 1 electro mechanically driven with, piezoelectric ceramic, single crystal material, electrostrictive, magnetostrictive variable reluctance, or magnetic materials or principles.

19. A cantilever tri-laminar bender transducer with two electro-mechanically bending circular or square plates, a center support post having opposed ends for respectively supporting the two circular or square plates, each said plates comprised of an inactive substrate and opposed piezoelectric plates forming the opposed sides and integrally formed with said inactive substrate, said inactive substrate and piezoelectric plates being coterminous so that the inactive substrate and opposed piezoelectric plates bend together when excited, and a voltage source for driving said plates in a planar bending mode through phase reversed excitation.

20. The cantilever bender transducer of claim 19 wherein said center support post is the only support between the plates leaving each plate free at an outer perimeter thereof so that the plates are cantilevered relative to the center support post.

21. A cantilever bender transducer comprising:
   a plurality of electromechanically active bending beam tines each having inner and outer tine ends and opposed sides;
   a center support member having opposed one and other sides;
   the inner ends of respective tines commonly supported at the center support member;
   one pair of tines of the plurality connected to the one side of the center support member and the other pair of tines of the plurality connected to the other side of the center support member and extending in the opposite direction to the one pair of tines;
   each tine comprised of an inactive substrate and opposed piezoelectric plates forming the opposed sides and integrally formed with said inactive substrate, said inactive substrate and piezoelectric plates being coterminous so that the inactive substrate and opposed piezoelectric plates bend together when excited, and a voltage source for driving said tines.

22. The cantilever bender transducer of claim 21 further including two tie rods for compression of the piezoelectric plates.

23. The cantilever bender transducer of claim 21 including an end mass connected to at least one tine and providing an improved coupling coefficient.

* * * * *